(12) United States Patent
Zahneisen et al.

(10) Patent No.: US 10,429,476 B2
(45) Date of Patent: Oct. 1, 2019

(54) ALGEBRAIC RECONSTRUCTION METHOD FOR OFF-RESONANCE AND EDDY-CURRENT CORRECTION IN FUNCTIONAL AND DIFFUSION WEIGHTED MAGNETIC RESONANCE IMAGING

(71) Applicant: The Board of Trustees of the Leland Stanford Junior University, Palo Alto, CA (US)

(72) Inventors: Benjamin Zahneisen, Menlo Park, CA (US); Roland Bammer, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 39 days.

(21) Appl. No.: 15/827,650

(22) Filed: Nov. 30, 2017

(65) Prior Publication Data
US 2019/0162807 A1    May 30, 2019

Related U.S. Application Data

(60) Provisional application No. 62/428,835, filed on Dec. 1, 2016.

(51) Int. Cl.
*G01R 33/561*   (2006.01)
*G01R 33/56*    (2006.01)
(Continued)

(52) U.S. Cl.
CPC ...... *G01R 33/5611* (2013.01); *G01R 33/4818* (2013.01); *G01R 33/5608* (2013.01); *G01R 33/56518* (2013.01); *G01R 33/4806* (2013.01)

(58) Field of Classification Search
CPC ............ G01R 33/5611; G01R 33/5608; G01R 33/4818; G01R 33/56518; G01R 33/4806
See application file for complete search history.

(56) References Cited

U.S. PATENT DOCUMENTS 6,476,606 B2   11/2002  Lee
7,282,917 B1*  10/2007  Brau ............... G01R 33/5611
                                                 324/309
(Continued)

OTHER PUBLICATIONS

Andersson et al., How to correct susceptibility distortions in spin-echo echo-planar images: application to diffusion tensor imaging, NeuroImage 20, pp. 870-878, 2003 (Year: 2003).*
(Continued)

*Primary Examiner* — Daniel R Miller
(74) *Attorney, Agent, or Firm* — Lumen Patent Firm

(57) ABSTRACT

Improved correction of MRI images is provided making use of three main principles. First, a hybrid representation of the image reconstruction problem is used where the raw MRI data is Fourier transformed in x to provide a $x$-$k_y$-$k_z$ representation. Second, blip-up blip-down acquisition is performed to provide data having equal and opposite regular k-space encoding. Third, joint least squares reconstruction is performed using a singular value decomposition of a joint blip-up, blip-down encoding matrix. The encoding matrix includes at least the effects of regular k-space encoding and known phase variations due to system non-ideality. Preferably, suitable regularization of the encoding matrix based on its singular values is used to automatically remove poorly conditioned parts of the data.

9 Claims, 12 Drawing Sheets

(51) Int. Cl.
    *G01R 33/48*     (2006.01)
    *G01R 33/565*     (2006.01)

(56) References Cited

U.S. PATENT DOCUMENTS

| | | | |
|---|---|---|---|
| 2004/0136608 A1* | 7/2004 | Rosenfeld | G06T 3/4007 382/276 |
| 2016/0139222 A1 | 5/2016 | Frydman et al. | |
| 2016/0341808 A1 | 11/2016 | Zhang et al. | |

OTHER PUBLICATIONS

Hansen, The truncated SVD as a method for regularization, Numerical Analysis Project, Manuscript NA-86-36, Stanford University, 1986 (Year: 1986).*

Zahneisen et al., "Extended hybrid-space Sense for EPI:Off-resonance and eddy current corrected joint interleaved blip-up/down reconstruction", Mar. 28, 2017, NeuroImage v153 pp. 97-108.

Zhu et al., "Hybrid-space Sense reconstruction for simultaneous multi-slice MRI", Aug. 2016, IEEE Trans. Medical Imaging v35n8 pp. 1824-1836.

* cited by examiner

ALGEBRAIC RECONSTRUCTION METHOD FOR OFF-RESONANCE AND EDDY-CURRENT CORRECTION IN FUNCTIONAL AND DIFFUSION WEIGHTED MAGNETIC RESONANCE IMAGING

CROSS REFERENCE TO RELATED APPLICATIONS

This application claims the benefit of U.S. provisional patent application 62/428,835, filed on Dec. 1, 2016, and hereby incorporated by reference in its entirety.

FIELD OF THE INVENTION

This invention relates to magnetic resonance imaging.

BACKGROUND

Correction of magnetic resonance imaging (MRI) results is often necessary due to various factors, such as off-resonances, which are generally defined as being deviations of the main MRI magnetic field (B0) from an ideal state of perfect uniformity. Even if the deviations from field uniformity are known, how to apply the corresponding correction in practice remains a nontrivial technical problem, with various approaches having their plusses and minuses. One class of approaches for image correction applies the correction in the image domain. Another class of approaches applies the correction in k-space, which can have improved noise performance relative to image-space correction, but can result in difficulties when system nonidealities lead to a pile-up of data in a single voxel that can't be disentangled in subsequent processing. A blip-up, blip-down strategy is known to deal with this problem, since if a voxel has signal pile-up in the blip-up acquisition, it will be well behaved in the blip-down direction, and vice versa. However, it can be troublesome to identify regions in the image where the blip-up data should be used instead of the blip-down data (or vice versa).

SUMMARY

In this work, improved correction of MRI images is provided making use of three main principles. First, many MRI acquisitions are fully sampled in one direction (x) and undersampled in the other two directions (y and z). In such cases, it is helpful to consider a hybrid representation of the image reconstruction problem where the raw MRI data is Fourier transformed in x to provide a x-$k_y$-$k_z$ representation. Second, blip-up blip-down acquisition is performed to provide data having equal and opposite regular k-space encoding (in the x direction). Third, joint least squares reconstruction is performed using a singular value decomposition of a joint blip-up, blip-down encoding matrix. The encoding matrix includes at least the effects of regular k-space encoding and known phase variations due to system non-ideality. Suitable regularization of the encoding matrix based on its singular values provides an elegant way to automatically remove poorly conditioned parts of the data (e.g., from voxels where signal pile-up occurs). These parts of the data correspond to small singular values that are discarded from the reconstruction.

An exemplary embodiment of the invention is a method of providing corrected magnetic resonance imaging including the following steps:

1) acquiring raw MRI data that is fully sampled in a first direction (x), undersampled in a second direction (y) and undersampled in a third direction (z), where the raw MRI data includes first raw MRI data and second raw MRI data having equal and opposite regular k-space encoding (i.e., blip-up, blip-down);

2) performing a 1-D Fourier transformation of the raw MRI data in the first direction, thereby providing hybrid MRI data, where the hybrid MRI data includes first hybrid data ($s_{up}$) corresponding to the first raw MRI data and second hybrid data ($s_{down}$) corresponding to the second raw MRI data;

3) determining a first effective encoding matrix ($F_{up}$) that includes at least the effects of regular k-space encoding and known phase variations due to system non-ideality for the first hybrid data;

4) determining a second effective encoding matrix ($F_{down}$) that includes at least the effects of regular k-space encoding and known phase variations due to system non-ideality for the second hybrid data;

5) determining a joint least-squares solution for magnetization (m) in a matrix equation $(s_{up}, s_{down}) = (F_{up}, F_{down})m$ using a singular value decomposition of an effective joint encoding matrix $(F_{up}, F_{down})$; and 6) providing the magnetization (m) as an output. This is the MRI image.

The first raw MRI data and the second raw MRI data can be provided by a first acquisition of the first raw MRI data followed by a second acquisition of the second raw MRI data. Alternatively, the first raw MRI data and the second raw MRI data can be provided by a single MRI acquisition. k-space acquisition can be at the same points for blip-up and blip-down, or the acquisitions can be interleaved. More specifically, let the first raw MRI data be sampled at first k-space points and the second raw MRI data be sampled at second k-space points. The first k-space points and the second k-space points can coincide or they can be interleaved with each other.

Preferably, regularization of the singular value decomposition of the effective joint encoding matrix is used to discard contributions from singular values less than a singular value threshold. The singular value threshold can be adaptively selected such that 95% of an area under a singular value curve of the effective joint encoding matrix is from singular values above the singular value threshold.

Other corrections can be included in the reconstruction, including effects of MRI receiver coil sensitivity variations and effects of intensity variation of received raw MRI signals. More specifically, the first effective encoding matrix and the second effective encoding matrix can further include effects of MRI receiver coil sensitivity variations, and the first effective encoding matrix and the second effective encoding matrix can further include effects of intensity variation of received raw MRI signals.

DETAILED DESCRIPTION

A) Introduction

Figure 1:
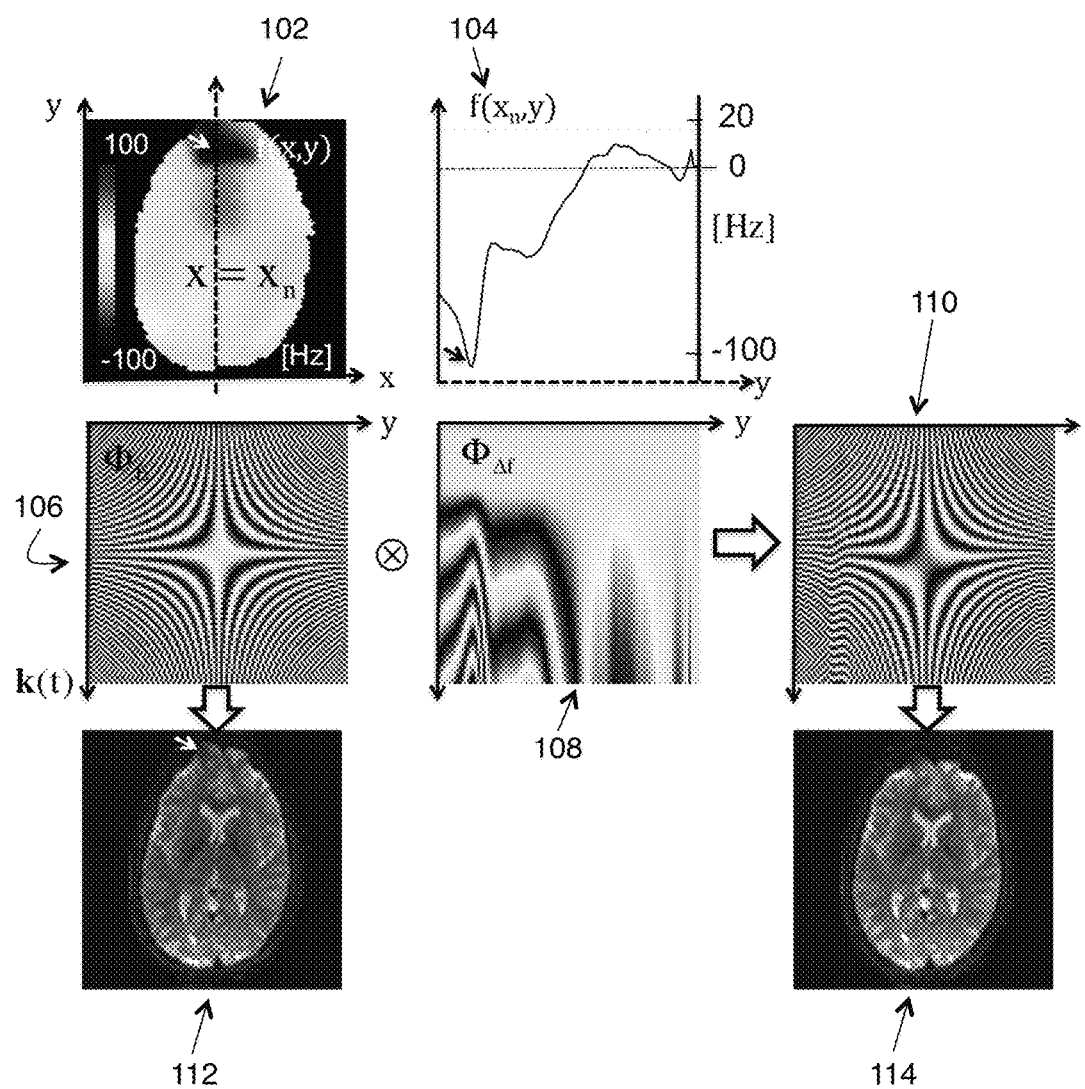
FIG. 1 shows off-resonance corrected algebraic reconstruction for a single slice.

Geometric distortions in echo planar imaging (EPI) are a fundamental problem and generally require some sort of correction. Local off-resonances, due to shim imperfections in combination with the low readout bandwidth along the phase encode direction in an EPI train, lead to a spatial shift of the reconstructed voxel along the phase encode direction. Geometric distortions can lead to errors when registering the functional imaging data to an undistorted anatomical scan and voxels might be shifted on top of each other and become indistinguishable.

The same mechanism is responsible for eddy-current distortions in diffusion weighted imaging (DWI) and diffusion tensor imaging (DTI). Here, the off-resonances are not caused by shim imperfections due to susceptibility changes within the brain but by residual eddy currents in the gradient coils due to the strong gradient pulses used for diffusion weighting. Especially in DTI this is a major problem because the eddy-current distortions depend on the diffusion direction which causes a misalignment of voxels from different volumes that are used to fit a tensor model to the data and thereby resulting in a blurring effect.

Methods to correct for geometric distortions in EPI have been considered in the literature. The field map can be acquired as a separate scan in order to calculate a 1D pixel shift map. The pixel shifts are subsequently corrected in the image domain by 1D interpolation along the phase-encode direction. A similar method uses the EPI acquisition itself to estimate the field map by acquiring a set of images within a range of echo time (TE) values. As in the previous approach, 1D resampling in the image domain unwinds voxel shifts. Such methods can be classified as field-mapping approaches as they use the underlying off-resonance field to infer the pixel shift map, taking into account specific EPI acquisition parameters like echo spacing and effective readout duration.

A second class of correction methods aim at measuring the pixel shift map directly, commonly referred to as point-spread-function (PSF) mapping. The measured image is the convolution of the undistorted voxel intensity and the PSF. Off-resonance correction is performed by de-convolving the acquired image with the measured PSF. The PSF approach is regarded in the literature as providing a superior solution to the problem of geometric and intensity distortions in EPI compared to field map approaches.

For non-Cartesian trajectories like spirals the effect of off-resonances on the PSF is not a simple spatial shift but a more complex blurring. In one report the field effects are modeled in the forward signal equation used to reconstruct the spiral data by means of a conjugate gradient SENSE (SENSitivity Encoding) approach. If field effects are included, the forward model is no longer a Fourier Transform and the highly computationally efficient non-uniform FFT (NUFFT) can no longer be used.

Dynamic variations in off-resonance pose another challenge for most EPI applications. On top of a static off-resonance map dynamic fluctuations like eddy-current effects in DWI or respiration induced shim changes in fMRI, cause additional changes. A common strategy to measure dynamic field maps is based on relative changes of the phase of the EPI time series. Dynamic field maps are derived, either by slightly shifting the echo time or from a change in image phase directly.

The widely used blip-up/down approach is another fast and robust way to estimate the distortion field, i.e. the distorted PSF, from only two EPI acquisitions with inverted phase encoding direction and implemented in FSL (FMRIB Software Library, where FMRIB stands for Functional MRI of the Brain) as topup. Local distortions occur in opposite directions, compressed in the blip-up scan and stretched in the blip-down scan, or vice versa. For otherwise identical readout parameters the true voxel position is halfway in-between the blip-up and -down case.

A1) Limitations of Off-Resonance Correction

Knowing the field map allows one to directly or indirectly account for the additional phase evolution during the reconstruction process and thereby canceling its effect on the PSF. In the case of spin-echo EPI we can neglect complete voxel dephasing due to local gradients at tissue/tissue or tissue/air boundaries with large susceptibility differences. However, these local gradients can balance or even invert the gradients imposed by the nominal k-space trajectory of the phase encoding direction. The phase evolution of each voxel is then no longer unique or the local trajectory never reaches the center of k-space. This leads to an ill-posed reconstruction problem requiring prior information to be numerically stable. This effect can be easily visualized in image space by the finding that only stretched voxels can be corrected whereas signal pile up in a single voxel is impossible to disentangle. We know that by inverting the phase encoding direction we also invert the direction of geometric distortions; e.g. stretched voxels get compressed and vice versa. The blip-up/down strategy exploits this phenomenon by acquiring two sets of data, one with regular phase encoding direction and one with inverted phase encoding direction. During the correction process, based on the field map, one can identify regions with signal pile up in one acquisition mode and pick the information from the corresponding stretched region from the other mode.

A2) Parallel Imaging, Simultaneous Multi-Slice and EPI Reconstruction

The scale of geometric distortions ultimately depends on the time between two k-space lines, i.e. the echo spacing, of the fully sampled k-space. Parallel imaging (e.g., SENSE, GRAPPA (GeneRalized Autocalibrating Partial Parallel Acquisition)) offers the possibility to shorten the effective echo spacing while not relying on segmented (interleaved) EPI. However, parallel imaging acceleration reduces distortions but does not automatically translate to shorter volume TRs (here TR is the repetition time of the MRI sequence) because a significant amount of time is spent on signal excitation and fat suppression and, in the case of DW-EPI, on diffusion preparation. By employing simultaneous multi slice (SMS) imaging, the volume TR can be reduced by the SMS-factor. The g-factor penalty associated with the slice separation based on coil sensitivity variation can be greatly reduced by employing the blipped-CAIPI method (here CAIPI is short for Controlled Aliasing In Parallel Imaging) which effectively leads to a better distribution of aliased voxels from different slices similar to the original CAIPIRINHA technique (here CAIPIRINHA is short for Controlled Aliasing In Parallel Imaging Results IN Higher Acceleration). The slice-GRAPPA method and its derivatives perform the SMS reconstruction by treating it as a concatenation of 2D slices with slice offset dependent CAIPI shifts and slice-dependent GRAPPA kernels.

An alternative reconstruction approach is based on the formulation of SMS-encoding in terms of a 3D k-space where the in-plane and the SMS acceleration are essentially treated identically in k-space by using a 2D-GRAPPA method or in the image domain by using a 2D-SENSE approach.

A recently proposed hybrid-space SENSE method is an algebraic reconstruction that, after stripping the fully sampled x-direction, directly inverts the encoding matrix in the hybrid x-$k_y$-$k_z$-space and can therefore handle arbitrary, non-periodic CAIPI blip patterns. It was also shown that slice dependent ghost correction terms could be included in the reconstruction process.

A3) Off-Resonance Corrected and Joint Blip-Up/Down EPI Reconstruction

In this work we present an extension of the hybrid-space SENSE method that models off-resonance effects, T2* decay and motion-induced phase errors. By explicitly modeling these effects we automatically correct for them during the reconstruction. One immediate advantage is that we reconstruct complex data, which retains Gaussian noise properties compared to less favorable Rayleigh noise in the case of magnitude operations in the image domain. By performing a joint reconstruction of a segmented k-space acquisition where one segment is acquired in blip-up mode and the $2^{nd}$ segment in blip-down mode, we can simultaneously estimate the distortion field due to off-resonances and eddy currents and reduce the g-factor penalty in the case of accelerated acquisitions. The joint reconstruction ensures that we make optimal use of available k-space information especially in regions with strong off-resonance gradients. We make use of established methods to estimate the distortion field in the image domain, namely FSL's topup.

B) Theory

B1) Off-Resonance Corrected Algebraic Reconstruction Including Regularization

In theory, off-resonances affect all acquired k-space samples. However, for an EPI type acquisition one can safely ignore off-resonance effects along the readout direction because of the short acquisition along the read direction compared to the slow phase encoding direction. By performing a 1-dimensional Fourier Transformation along the $k_x$-domain the k-space data $s(k_x,k_y,k_z)$ is transformed to $(x,k_y,k_z)$-hybrid space.

The signal from receiver coil i, $s_i(x=x_n,t)$ at spatial position $x_n$ and as a function of time t from the start of EPI readout, can be written as $$s_i(x=x_n,t)=\sum_{y=1}^{N_y}\sum_{z=1}^{N_z} m(x_n,y,z)C_i(x_n,y,z)(e^{i\Phi(x_n,y,z,t)}R(x_n,y,z,t)) \qquad [1]$$

where $m(x_n,y,z)$ describes the complex magnetization at voxel position index $(x_n,y,z)$, $C_i$ is the sensitivity variation for coil i, $\Phi(x_n,y,z,t)$ describes the temporally varying phase modulation and R represents any intensity variation, i.e. relaxation and/or spin echo formation during the readout. The phase modulation $\Phi=\Phi_E+\Phi_{\Delta f}$ has contributions from regular k-space encoding $$\Phi_E(x_n,y,z,t)=2\pi(k_y(t)y+k_z(t)z) \qquad [2]$$

and phase variations $$\Phi_{\Delta f}(x_n,y,z,t)=\Delta f(x_n,y,z)\cdot t \qquad [3]$$

due to an off-resonance field $\Delta f$ in [rad/s].

For every position $x=x_n$ we can rewrite Eq. [1] for all receiver coils in matrix notation with the unknown magnetization $m \in \mathbb{C}^{N_y N_z \times 1}$ and the signal vector $s \in \mathbb{C}^{N_s N_c \times 1}$ that consists of all $N_s$ acquired $k_y$-$k_z$ k-space samples times the number of receiver coils $N_c$. The matrices C, E, W, R $\in \mathbb{C}^{N_s N_c \times N_y N_z}$ model the measurement or encoding process where: C is the coil sensitivity variation, E the phase evolution due to gradient encoding according to Eq. [2], W describes off-resonance effects due to the field map in Eq. [3], and R models intensity variations, i.e. signal decay or spin echo recovery during the readout. The effective encoding matrix $F \in \mathbb{C}^{N_s N_c \times N_y N_z}$ is the Hadamard product (i.e. element-wise matrix multiplication) of the various contributions $$F=C \circ E \circ W \circ R \qquad [4]$$

and we can write the forward model as $$s=Fm. \qquad [5]$$

In order to invert the rectangular matrix F we use a singular value decomposition (SVD) approach. The SVD of F results in three matrices $F=U\Sigma V^*$ where U and V* are unitary matrices and $\Sigma=\text{diag}(\sigma_1, \sigma_2, \ldots, \sigma_{N_y N_z})$ is a diagonal matrix of singular values in descending order. A solution of Eq. [5] in a least squares sense is given by $m=F^+s$ with $$F^+ = V \sum^{-1} U^* \text{ and } \sum^{-1} = \text{diag}\left(\frac{1}{\sigma_1}, \frac{1}{\sigma_2}, \ldots, \frac{1}{\sigma_{N_y N_z}}\right). \qquad [6]$$

A regularized solution of Eq. [5] can be readily obtained by multiplying the inverse singular value $$\frac{1}{\sigma_n}$$

with a weighting coefficient $w_n$ resulting in $$\sum_{reg}^{-1} = \text{diag}\left(\frac{w_1}{\sigma_1}, \frac{w_2}{\sigma_2}, \ldots, \frac{w_n}{\sigma_{N_y N_z}}\right) \text{ and } F^+_{reg} = V \sum_{reg}^{-1} U^*. \qquad [7]$$

Throughout this work we will use a truncated SVD regularization approach, i.e. we completely suppress contributions from singular values below a certain threshold $\lambda$ resulting in $$w_n = \begin{cases} 0 & \text{for } \sigma_n < \lambda \\ 1 & \text{for } \geq \lambda \end{cases}.$$

The rationale behind this approach is that one tries to solve a sub-problem that only includes meaningful information and is therefore well conditioned.

B2) Noise Propagation Theory

Furthermore, for parallel imaging acceleration we can calculate the g-factor penalty for a given encoding matrix F by propagating noise through the reconstruction process. For the sake of simplicity, we only consider the noise amplification for F relative to a fully sampled scan without off-resonance effects. The noise covariance matrix $X_{cov}^{hyb} \in \mathbb{C}^{N_y N_z \times N_y N_z}$ for a regularized reconstruction of F is given as $$X_{cov}^{hyb} = F_{reg}^+ (F_{reg}^+)^T \quad [8]$$

and the noise covariance matrix for the fully sampled (SENSE reconstruction with R=1) case is given by $$X_{cov}^{full} = C^T C \quad [9]$$

From that the g-factor map g for a total acceleration factor R is constructed as $$g(x_n, r(y, z)) = \text{diag}\left(\sqrt{\frac{X_{cov}^{hyb}}{X_{cov}^{full}}}\right) / \sqrt{R} \quad [10]$$

Note that Eq. [10] is scaled by the $\sqrt{R}$ noise increase due to a decrease in k-space samples.

FIG. 1 illustrates the reconstruction approach for a single slice, single coil example. The off-resonance map in [Hz] is displayed as 102 and a 1d profile $\Delta f(x_n, y)$ at location $x=x_n$ is plotted in 104. The off-resonance induced phase variation over time in 108 reflects the profile from 104 as a linearly increasing phase over the vertical time axis. The nominal gradient encoding matrix is shown in 106, which in the case of full sampling corresponds to the matrix notation of a 1D Fourier transform. Adding both phase contributions yields the distorted encoding matrix in 110. Neglecting off-resonance effects when setting up the encoding matrix in 106 results in a reconstruction with geometric distortions in the anterior part of the brain, depicted by the white arrow in 112. Modeling off-resonances by inverting the distorted encoding matrix from 110 results in a reconstruction with greatly reduced distortions as shown in 114.

B3) Local Off-Resonance Gradients can Lead to an Ill-Posed Reconstruction Problem A single voxel experiences a shift in the presence of off-resonances and, by accounting for the phase evolution during the reconstruction, one can perfectly unwind the shift. For an actual brain scan and a typical field map with its local minima and maxima, the problem is more complex. On a local level, i.e. for a specific region of the brain, the k-space encoding gradients that are played out can be counterbalanced by spatial gradients due to the off-resonance field. The local k-space trajectory might deviate from the nominal trajectory considerably.

Figure 2:
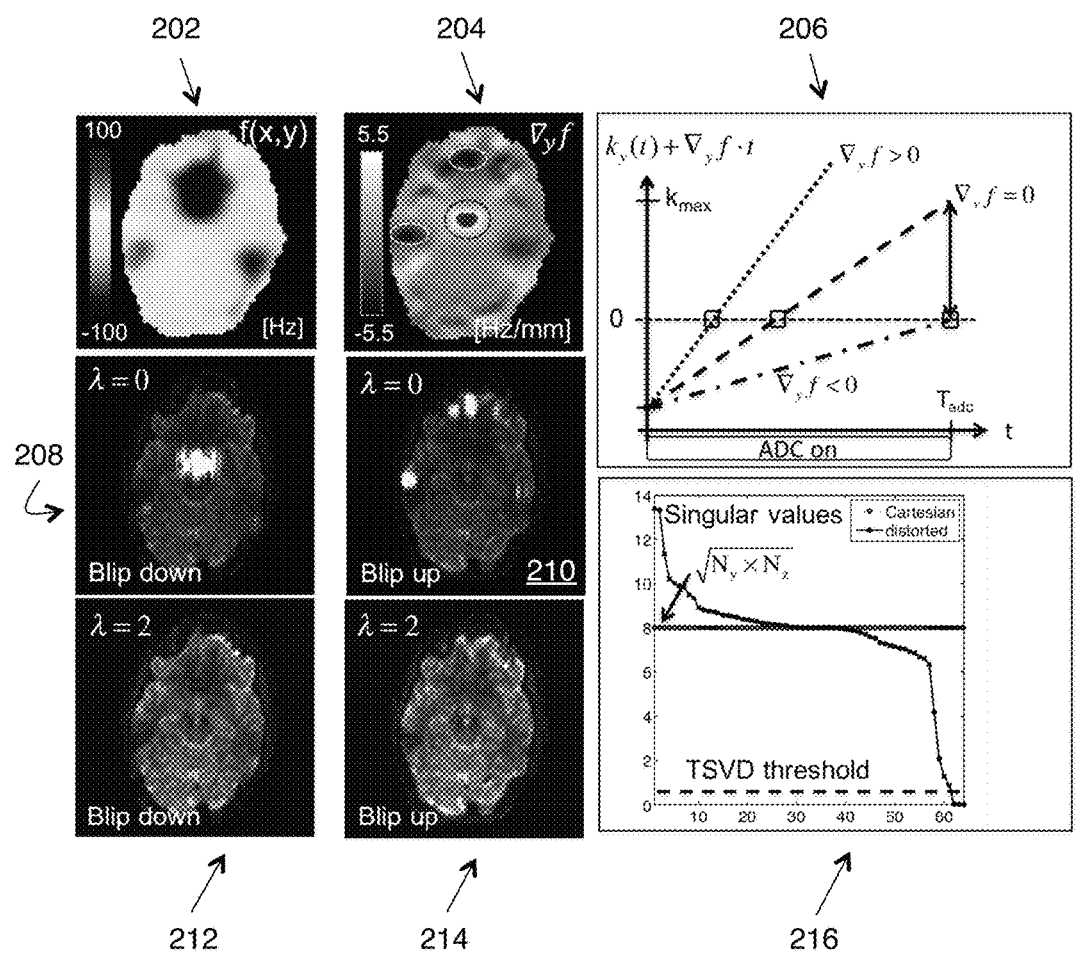
FIG. 2 demonstrates the effect of an ill-posed reconstruction problem.

202 of FIG. 2 displays a typical off-resonance distribution $f(x,y)$ in [Hz] for an axial slice through the midbrain where the effect of the air filled nasal cavities and the sinuses results in strong negative troughs in the fieldmap. The gray scale image in 204 displays the spatial gradient along the y-direction $$\nabla_y f = \frac{\partial f(x, y)}{\partial y}$$

in [Hz/mm]. 206 schematically depicts the effective k-space value $k_y(t) + \nabla_y f \cdot t$ during the readout (=ADC on) for ⅝ partial Fourier undersampling. The nominal k-space trajectory ($\nabla_y f = 0$) is depicted with a dashed line with complete refocusing, i.e. the echo, occurring after 25% of the readout duration. If the local gradient is aligned with the nominal trajectory ($\nabla_y f > 0$, dotted line on 206) complete refocusing occurs earlier. If the local gradient has a negative sign ($\nabla_y f < 0$, dot-dashed line on 206) and is strong enough, the echo is shifted outside the acquisition window and the low order frequency information associated with the center of k-space is completely lost. We can therefore calculate the minimal field map gradient amplitude that is necessary to move the peak of the echo beyond the acquisition window (ADC). If we assume that the highest spatial frequency $k_{max}$ is acquired at the end of the ADC, and that the gradient moment due to the local off-resonance is given as $k_{off}(t) = \nabla_y f \cdot t$, the cutoff fieldmap gradient where we expect incomplete refocusing is given as $$\nabla_y f_{min} = \frac{k_{max}^y}{t_{adc}}$$

where $t_{adc}$ stands for the total readout duration. Inverting the phase encode direction for a blip-down scan also inverts the sign of the threshold frequency.

Consider the following example with typical EPI acquisition parameters: For a FOV of 220 mm and matrix size of 100 in FIG. 2, $k_{max}^y$ is given as $$k_{max}^y = \frac{1}{0.22m} \frac{100}{2} = 227.3 \left[\frac{1}{m}\right]$$

and for $t_{adc} = 43$ [ms] the local cutoff fieldmap gradient amplitude is $$\nabla_y f_{min} = 5.3 \left[\frac{Hz}{mm}\right].$$

Regions of the gradient field in 204 that surpass this value are circled with black (positive) and white (negative) dashed lines. For an off-resonance corrected reconstruction without regularization, the regions with high signal pile-up match the local peaks in the gradient field map from 204. We can also see that a positive gradient only affects the blip-down scan in 208 and vice versa the blip-up scan in 210 is only affected by negative gradient values. The regularized reconstructions (212 and 214) with singular value threshold $\lambda=0.4$ (216) display no regions with extreme signal pile-up.

C) Methods

C1) Field Map/Distortion Field Estimation from EPI Time Series

A method for off-resonance correction can only be as good as the quality of the underlying off-resonance map or field map $\Delta f$. Because of its robustness and straightforward implementation we decided to use a blip-up/down acquisition in order to get a field map estimate. The blip-down acquisition is implemented by inverting the amplitude of phase encoding gradients while keeping all other scan parameters identical. We used FSL 5.0, a publically available software package, and specifically topup, to calculate the distortion field and the field map. If not mentioned otherwise we relied on settings from the standard configuration file (b02b0.cnf) that is part of the software distribution. A field map is calculated for each blip-up/down pair of the acquired time-series and therefore each field map includes dynamic changes due to eddy currents and/or shim modulations.

C2) Choosing the Regularization Parameter

The choice of the regularization parameter $\lambda$ is important. If the selected value is too small, it might lead to an unstable solution with large intensity variations. If $\lambda$ is too large, the over-regularized reconstruction is missing finer details. Our choice of $\lambda$ is based on the singular values for fully sampled, single coil FT reconstruction. In that case, the encoding matrix F from Eq. [4] for $N_y \times N_z$ voxels is an invertible Fourier transform matrix with identical singular values $\sigma_n$ given by $\sigma_n^{full} = \sqrt{N_y \times N_z}$ (see 216 on FIG. 2). For all reconstructions that do not model off-resonance effects, $\lambda$ is chosen to be 1% of the fully sampled singular values. For off-resonance corrected reconstructions, the truncated SVD threshold is increased to 5% of $\sigma^{full}$.

C3) Complex Averaging & g-Factor Reduction by Joint Blip-Up and Down Reconstruction In the previous sections, we have seen how a blip-up/down acquisition can be used to calculate a static off-resonance map and dynamic changes thereof by estimating the warp field that maps both volumes onto each other. From the warp field one can derive the field map, which is used to perform an off-resonance corrected reconstruction based on Eq. [6] both for the blip-up and the blip-down scan. If we correct for geometric distortions, both separately reconstructed complex magnetizations are in the same undistorted space. We can therefore perform a joint reconstruction by replacing Eq. [5] with $$s_{\uparrow\downarrow} = F_{\uparrow\downarrow} m \text{ with } s_{\uparrow\downarrow} = \begin{pmatrix} s_\uparrow \\ s_\downarrow \end{pmatrix} \text{ and } F_{\uparrow\downarrow} = \begin{pmatrix} F_\uparrow \\ F_\downarrow \end{pmatrix} \quad [11]$$

$F_\uparrow$ and $F_\downarrow$ are the effective encoding matrices for the blip-up and -down trajectories $k_{yz}^{up}(t)$ and $k_{yz}^{down}(t)$ and the joint encoding matrix $F_{\uparrow\downarrow}$ is now $\in \mathbb{C}^{(N_s^{up}+N_s^{down})N_c \times N_y N_z}$.

By performing a joint reconstruction, we increase (i.e. double) the number of equations while keeping the number of unknowns constant. This results in a better conditioning of the inverse reconstruction problem. For regions with no off-resonances (f=0) we expect the same $\sqrt{2}$-SNR gain as we would get for complex averaging under white noise characteristics. For regions that suffer from signal loss for one acquisition mode due to extreme off-resonance gradients (see 208 and 210 on FIG. 2) the solution is dominated by k-space information from the reversed mode and little to no SNR gain is to be expected. The regularized reconstruction approach therefore automatically picks the right amount of k-space information that has meaningful contributions to the solution. It is worth noting here that the joint reconstruction relies on a precise estimation of the field map and therefore requires eddy current corrected field maps to be applied to diffusion weighted data.

Besides its complex averaging properties, the joint reconstruction also has a beneficial effect on the g-factor penalty. In the case of accelerated acquisitions (in-plane, SMS or a combination of both) one can select the k-space samples of the blip-up and down scan to be complementary to each other as one would do in a segmented acquisition. The joint reconstruction then effectively reduces the total acceleration factor, which results in reduced g-factor penalty. Shifting the undersampling pattern in k-space has no effect on the reconstructed magnitude and therefore does not affect the ability to estimate the distortion field from the separately reconstructed volumes.

C4) Phase Corrected Reconstruction (MUSE) for Diffusion Weighted Acquisitions

Combining k-space data from multiple excitations with strong diffusion weighting, as in a joint blip-up/down reconstruction, must take the inevitable phase variations between segments into account. These phase inconsistencies may come from micro- and macroscopic tissue movement during the presence of strong diffusion gradients. Accounting for off-resonances yields two undistorted images ($m_\uparrow$ and $m_\downarrow$) with similar magnitudes but with a significantly different relative phase $$\theta = \exp\left(i\left(\angle\left(\frac{m_\uparrow}{m_\downarrow}\right)\right)\right)$$

calculated by complex division between $m_\uparrow$ and $m_\downarrow$. We account for the phase variation by generating a $2^{nd}$ set of virtual coil sensitivities $C_j^{MUSE} = C_j \circ \theta$ that absorbs the phase difference. We then replace the original coil sensitivities $C_j$ in $F_\downarrow$ from Eq. [11] with the phase corrected sensitivities $C_j^{MUSE}$ thereby modeling the phase difference explicitly in the encoding matrix.

C5) Image Acquisition Protocols

All measurements were performed at 3 T (GE, signa) using a 32-channel head coil array (Nova) for signal reception. We used an in-house developed diffusion-weighted SMS SE-EPI (spin-echo EPI) sequence with support for multi b-value acquisitions. Fat suppression was achieved by inverting the slice selection gradient direction for the refocusing pulse. Multi-band excitation and refocusing was implemented by summing over cosine modulated single band pulses with SAR and peak-B1 reduction achieved by phase modulation. After transfer of the raw k-space data, off-line reconstruction was performed in MATLAB®. Its internal svd function was used to perform the singular value decomposition.

Coil sensitivity maps were derived from a fully sampled, low resolution, single band EPI acquisition with identical echo spacing and number of phase encoding steps that was acquired at the beginning of the EPI time series. The null-space method was used to derive the sensitivity maps. It is part of the ESPIRIT framework, distributed as part of the BART reconstruction software package. EPI ghost correction parameters were calculated from the reference scan by iteratively minimizing the image entropy as a function of the zero and $1^{st}$ order phase difference between even and odd lines in the EPI train. Missing k-space lines due to Partial Fourier acceleration were filled with zeros. No reconstruction exploiting conjugate phase symmetry was employed.

Figure 4:
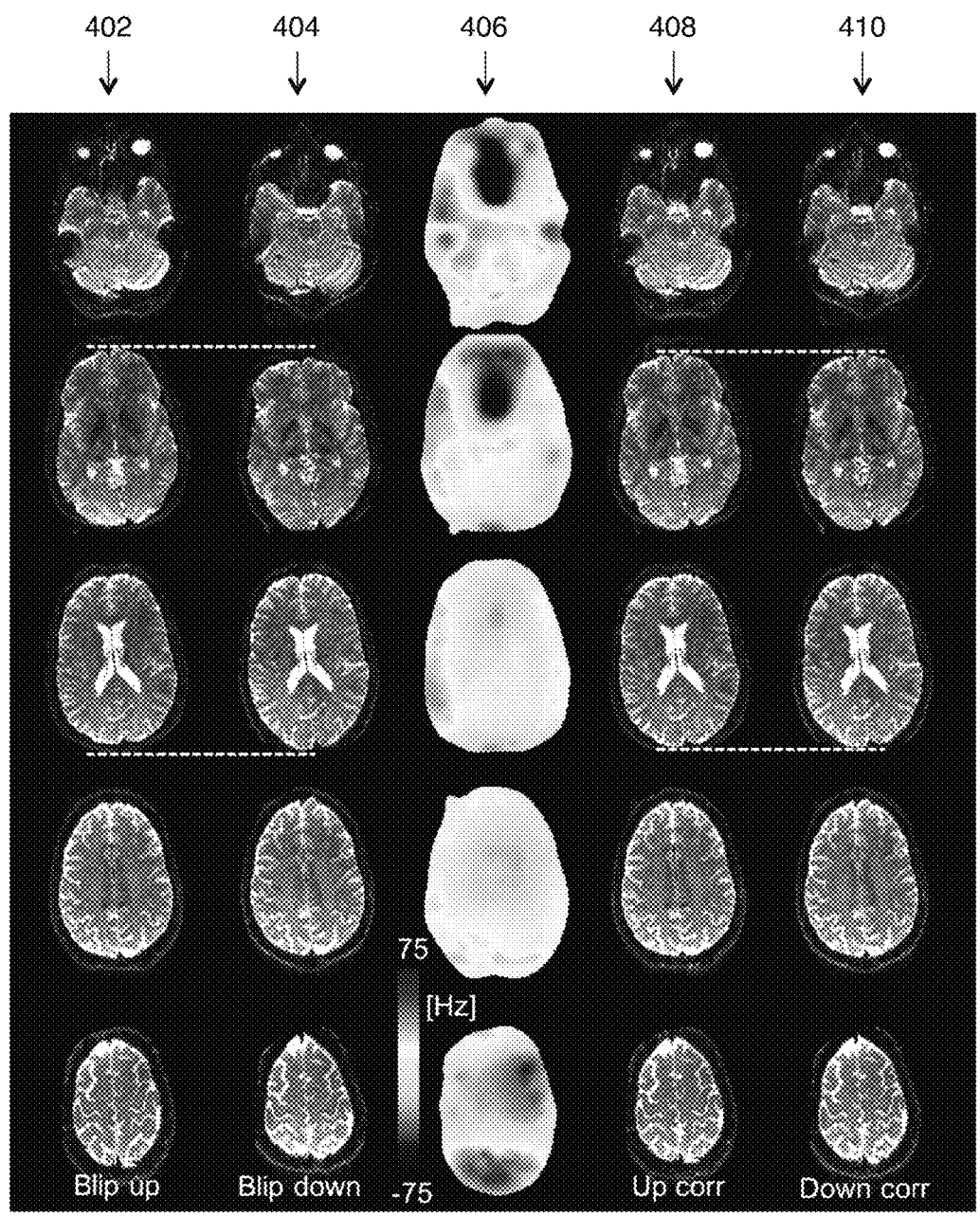
FIG. 4 is a demonstration of off-resonance corrected reconstruction.
Figure 5:
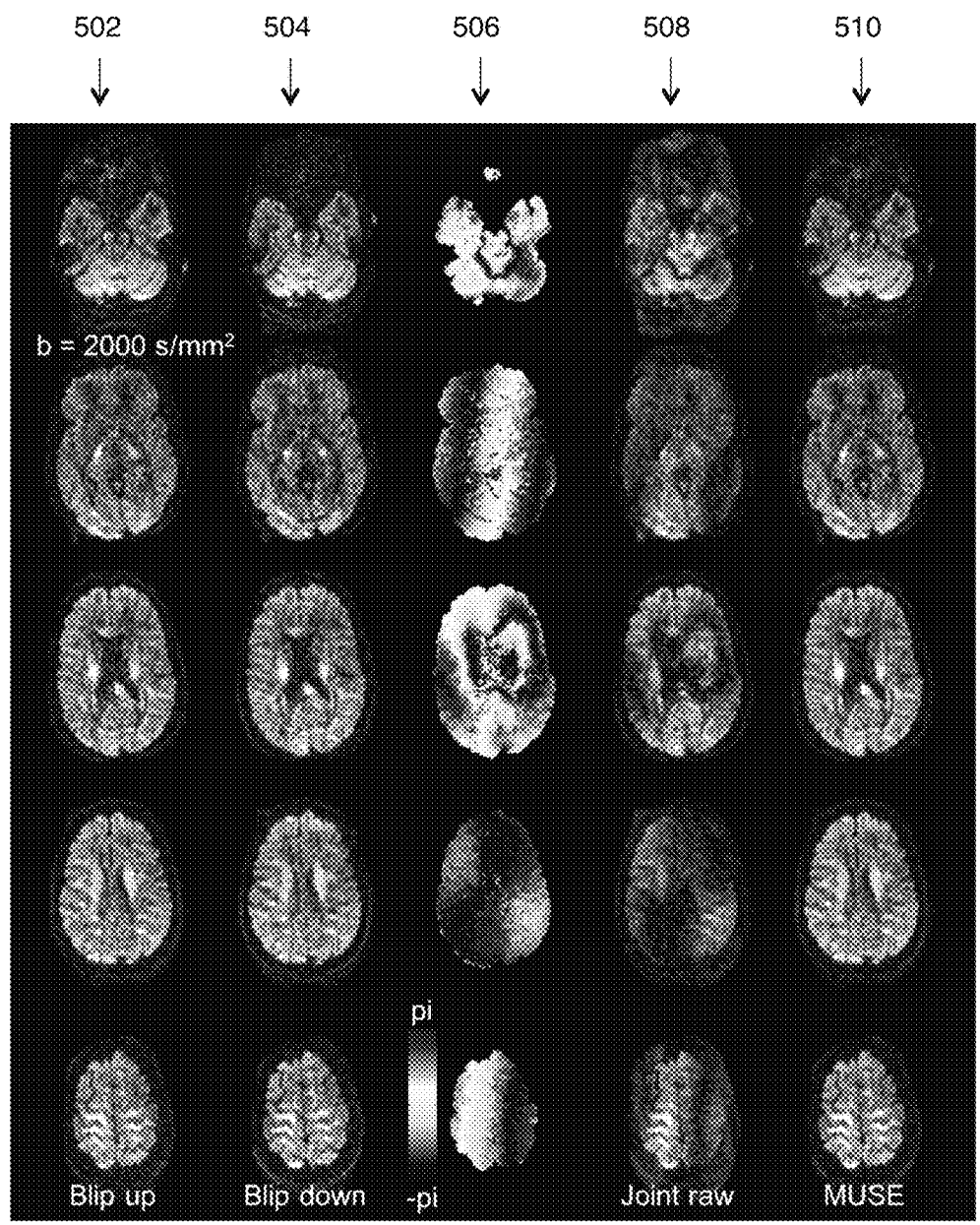
FIG. 5 is a further demonstration of off-resonance corrected reconstruction.
Figure 7:
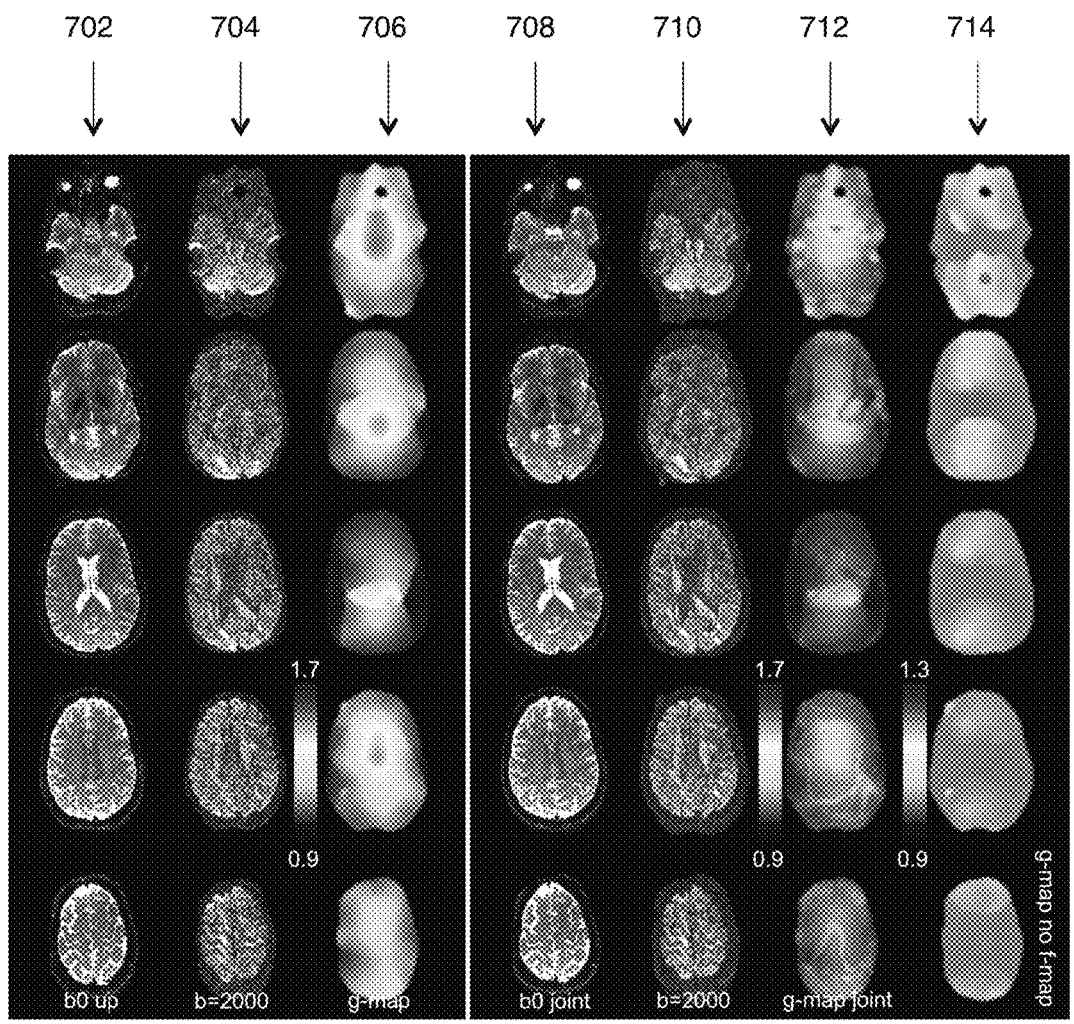
FIG. 7 shows a first example of g-factor penalty reduction by joint blip-up/down reconstruction.

A total number of 5 subjects were scanned on multiple occasions and in compliance with IRB (Internal Review Board) protocols with the following imaging parameters:

FIGS. 4,5, and 7: FOV=22×22 cm, $N_x \times N_y$=180×180, $R_y$=2, SMS-factor 2, blip-factor 2, 36 slices×1.7 mm, partial Fourier ⅝, echo spacing=1.3 ms, b=[0, 2000] s/mm².

Figure 8:
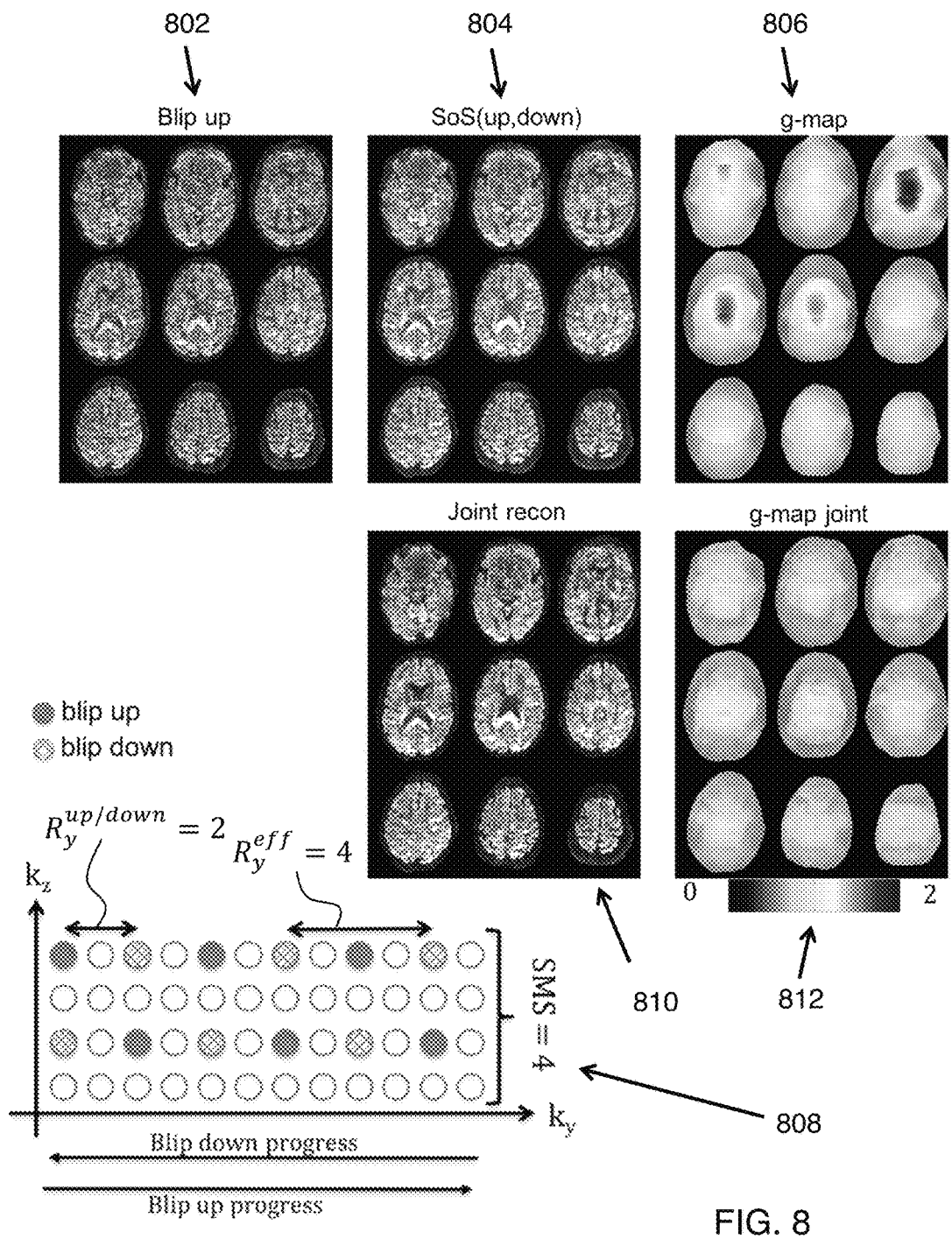
FIG. 8 shows a second example of g-factor penalty reduction by joint blip-up/down reconstruction.

FIG. 8: FOV=22×22 cm, $N_x \times N_y$=128×128, $R_y$=2, SMS-factor 4, blip-factor 2; partial Fourier ⅝, echo spacing=0.55 ms, 48 slices×1.7 mm, b=[0, 2000] s/mm² with 30 diffusion directions and 2 b=0 scans.

Figure 3:
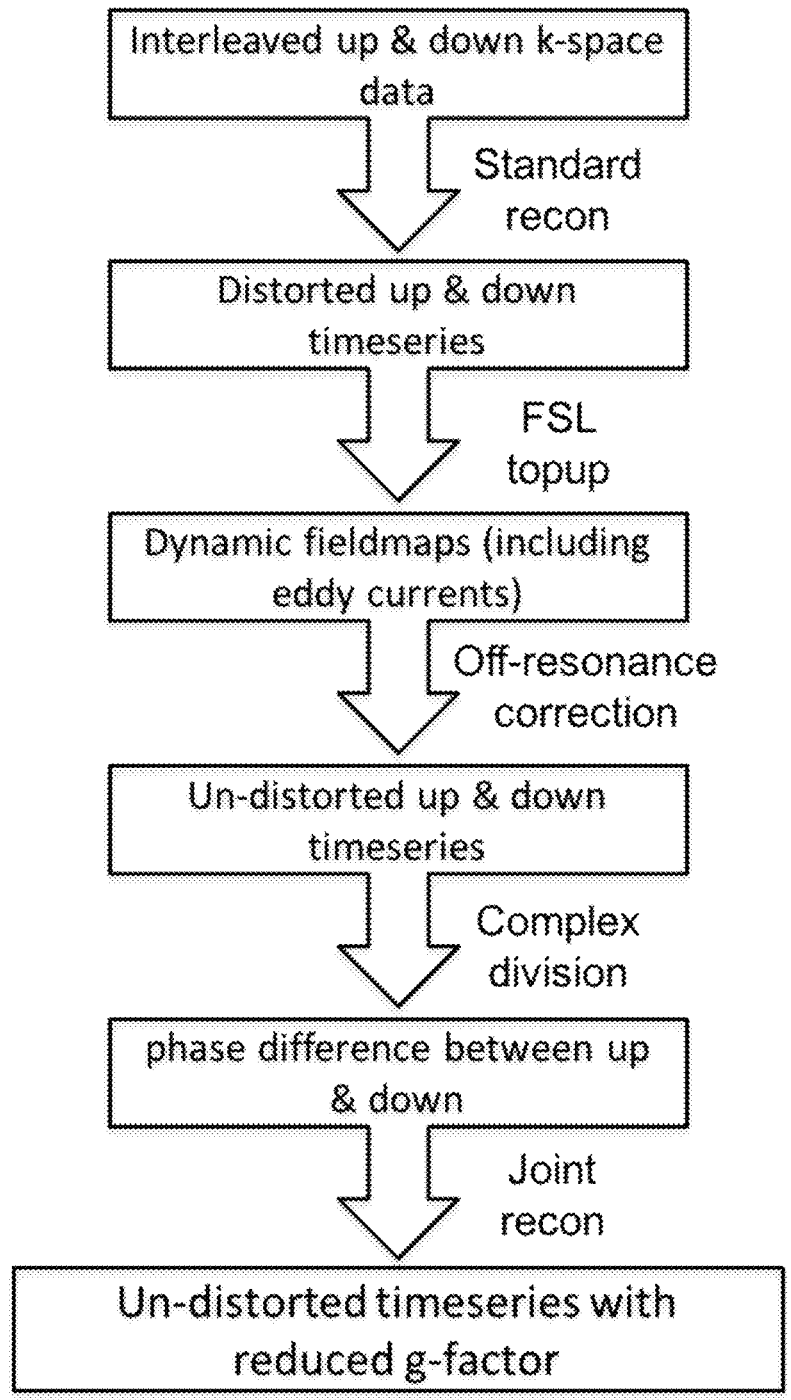
FIG. 3 shows a workflow for joint extended hybrid-space SENSE reconstruction.

The complete workflow for a joint reconstruction with eddy-current correction and phase map updates is shown in FIG. 3. The blip-up and down acquisitions are reconstructed separately and a field map is derived using FSL's topup that includes eddy current contributions. An off-resonance corrected reconstruction using the dynamic field map estimates is performed for up and down acquisitions separately. A MUSE phase difference map is calculated by complex division. Finally, the joint blip-up/down reconstruction is performed with all available k-space and coil sensitivity information that includes the phase difference maps.

D) Results

D1) Off-Resonance Correction for SMS Acquisition

FIG. 4 displays how the off-resonance corrected hybrid-space SENSE reconstruction results in significantly reduced geometric distortions for both blip-up and blip-down. Five slices with opposing geometric distortions for blip-up/down are displayed in 402 and 404. The estimated field map is shown in 406 and was calculated from 402 and 404. The off-resonance corrected reconstructions for blip-up/down are shown in 408 and 410. Corrected reconstructions (408 and 410) have significantly less distortion compared with the raw reconstructions (402 and 404).

D2) Phase Corrected Reconstruction of Segmented Data

For 502 and 504 on FIG. 5, the blip-up and down acquisitions for a b-value of b=2000 s/mm$^2$ were reconstructed separately. 506 on FIG. 5 shows the phase angle difference between up and down reconstructions. Straight-forward combination of both datasets and joint reconstruction without taking the phase into account leads to severe signal cancelations in 508 of FIG. 5. The phase corrected joint reconstruction in 510 of FIG. 5 is free from artifacts and we can expect an SNR gain of close to $\sqrt{2}$ due to complex averaging.

D3) Joint Reconstruction of Blip-Up/Down Scan and g-Factor Reduction

Figure 6:
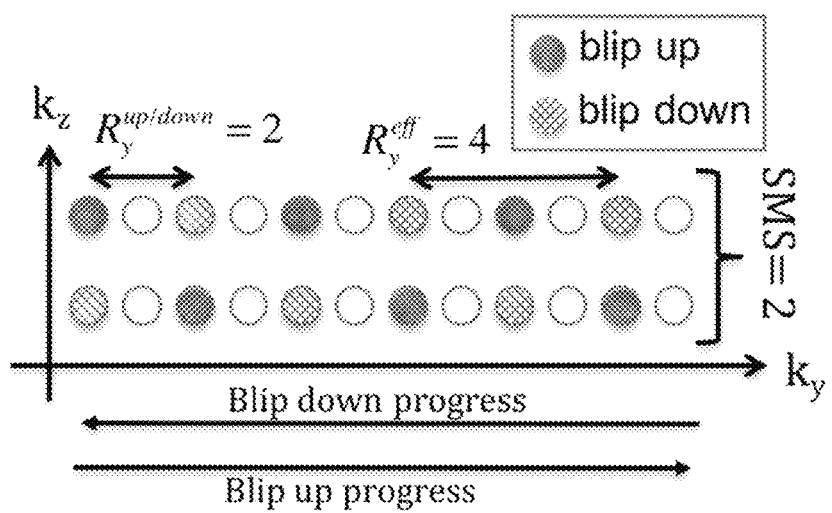
FIG. 6 shows an interleaved blip-up/down trajectory.

FIG. 6 depicts the k-space sampling pattern along the $k_y$-$k_z$-dimensions for SMS-factor 2 with CAIPI-factor 2 and two-fold in-plane acceleration. The solid dots are the samples acquired for the blip-up case. The total acceleration factor for each single shot acquisition is $R_{tot}$=4 and the CAIPI blip pattern distributes samples over both k-space planes along z. For the inverted readout direction (blip-down, hatched dots) the k-space pattern is shifted so that the sampling density is uniformly distributed and the total acceleration factor is reduced to 2.

Columns 702 and 704 of FIG. 7 show the blip-up reconstructions for b=0 and b=2000 s/mm$^2$, respectively. The g-factor map calculated using Eq. [10] for the blip-up trajectory corresponding to $R_{tot}$=4 is displayed in column 706 of FIG. 7. No off-resonance correction was employed in order to make the g-factor map comparable to a SENSE-type SMS reconstruction. The joint blip-up/down reconstructions are shown in 708 and 710 of FIG. 7. The g-factor penalty for the joint reconstruction in 712 of FIG. 7 is considerably reduced. Note that the g-factor now also depends on the altered encoding properties due to off-resonance gradients. The field map shines through the g-factor map and the region with the strongest off-resonances above the sinuses shows some g-factor increase. An ideal g-factor map for the joint reconstruction that neglects off-resonance effects is shown in 714 of FIG. 7 (note the difference in scaling).

A higher SMS-factor further increases the g-factor penalty as displayed in FIG. 8 for SMS-factor 4 and a b-value of b=2000 s/mm$^2$. Here 802 shows blip-up reconstruction only, 804 shows a sum-of-squares combination of blip-up and blip-down reconstruction, and 806 is a g-factor map for $R_{tot}$=8. The sampling patterns for the blip-up (solid dots) and blip-down (hatched dots) acquisitions are displayed in 808, each corresponding to a total acceleration of $R_{tot}$=8. Sum-of-squares combination of the blip-up and the blip-down reconstruction reduces the image noise due to averaging but the associated g-factor map is the same as for blip-up only. The joint blip-up/down reconstruction 810 is better conditioned, which results in improved SNR of the diffusion weighted images beyond the $\sqrt{2}$-gain due to the averaging effects. The g-factor map 812 for the joint reconstruction is considerably lower than the blip-up g-factor map.

Figure 9:
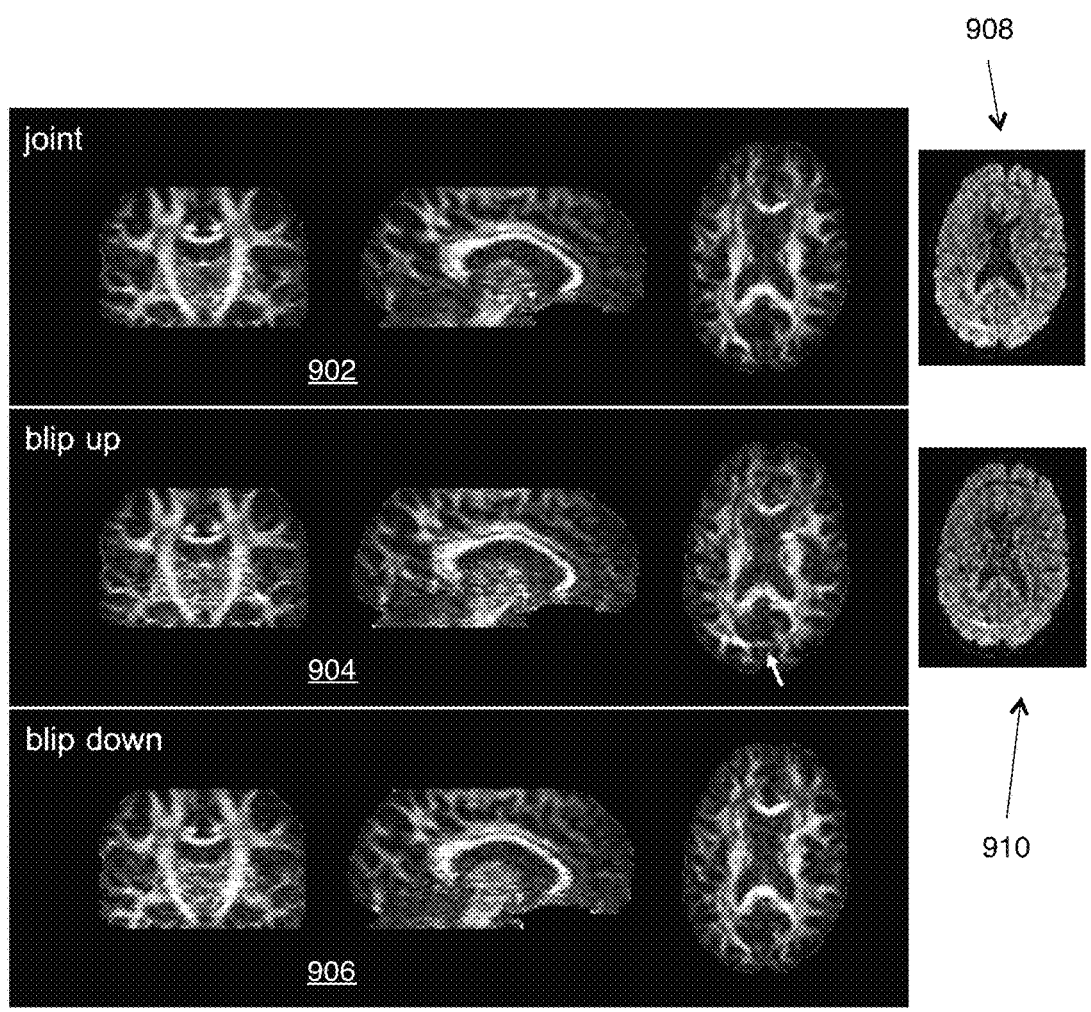
FIG. 9 shows fractional anisotropy (FA) maps from 30 directions for joint reconstruction compared to blip-up reconstruction and to blip-down reconstruction.

For the same dataset, fractional anisotropy (FA) maps were derived from a fit of the 30 acquired diffusion directions to a tensor model. 902 on FIG. 9 displays the FA map calculated for the joint reconstruction. In 904 and 906 of FIG. 9, the FA maps for separate reconstruction of blip-up and down scans are shown. The FA map for the joint reconstruction is less noisy especially in the center of the brain. It is noteworthy that the apparent white matter connection between brain hemispheres for the blip-up case (white arrow in 904), which is likely caused by insufficient fat suppression, is not present for the joint reconstruction. This is further illustrated by the reduced residual fat artifact in a transversal slice from the joint reconstruction in 908 compared to blip-up in 910.

E) Discussion

Modeling off-resonances in an algebraic reconstruction framework for EPI results in images with significantly reduced geometric distortions. The approach presented here can handle arbitrary combinations of in-plane and SMS acceleration, non-periodic and non-Cartesian CAIPI blip patterns, partial Fourier undersampling, and segmented k-space acquisition. We provide a k-space based analysis of how off-resonances affect the reconstruction and the implications of this for a successful correction strategy. The need for a regularized reconstruction is demonstrated for regions where local off-resonance gradients oppose the external gradients from k-space encoding. We have shown how the joint reconstruction of interleaved blip-up/down data leads to a significantly reduced g-factor penalty for accelerated acquisitions. Although the effectiveness of the g-factor reduction is reduced in regions with strong off-resonance gradients, the reduction in maximum g-factor penalty is still on the order of two for the chosen examples of two and fourfold SMS acceleration. The joint reconstruction also relaxes the requirement for regularization compared to a blip-up (or down) reconstruction because the affected regions in the separate reconstructions are complementary to each other. The blip-up reconstruction is well conditioned in regions where the unregularized blip-down reconstruction would result in signal pile up and vice versa. However, we found that small to moderate regularization for the joint reconstruction has no detrimental effect on the effective resolution while still making the reconstruction more robust with respect to inconsistencies from coil sensitivities and phase difference maps.

Combining blip-up and down k-space data is only feasible if we correct for distortions. Otherwise, the joint reconstruction results in blurring because regions that experience compression are combined with regions that experience stretching. It is therefore crucial to include eddy current contributions in the field map which then must be derived for each diffusion direction separately, prior to a joint reconstruction of a DWI acquisition. The workflow to achieve this is shown in FIG. 3 where the MUSE phase difference maps are individually calculated from a time series with off-resonance and eddy current correction. Theoretically, one could also use two scans with slightly different echo times TE instead of the blip-up/down approach. This approach has proven to work well for GRE (Gradient Echo) based acquisitions with little or no confounding effects on the image phase from other sources. For in vivo EPI acquisitions, small head motion, CSF (cerebro-spinal fluid) flow or pulsatility, and respiration are the most prominent sources that influence the image phase. The consequence is that there is no unique mapping between the measured phase difference and the underlying off-resonance field in contrast to PSF-mapping approaches that exploit the unique relationship between off-resonances and pixel shifts.

If multiple receiver coils are used for the acquisition, performing the off-resonance correction as an integral part of the image reconstruction is particularly useful; For regions where the off-resonance gradients increase the nominal gradient strength, k-space traversal along the phase encoding direction is faster than the nominal sampling distance. If sufficient coil sensitivity variation is available, we expect an improved reconstruction compared to a standard SENSE reconstruction with subsequent image domain resampling to undo the effect of off-resonances.

In addition, the hybrid-space SENSE framework allows for a slice dependent ghost correction for simultaneously excited slices and the reconstruction of non-periodic CAIPI blips along the SMS direction. In theory, the extended hybrid-space SENSE approach can also be employed for 3D-EPI or EVI (Echo Volumar Imaging) acquisitions without further modifications. In practice the limiting factor is most likely the memory requirements of the encoding matrix's singular value decomposition. Currently, a blip-up/down acquisition requires twice as long compared to a blip-up-only time series. The scan efficiency is greater for a joint blip-up/down reconstruction because of the reduced g-factor penalty, but the absolute acquisition time is longer. By acquiring the blip-down scan as a $2^{nd}$ spin echo after the blip-up readout, one might partially overcome the acquisition time penalty. In that case, however, one must account for the additional T2 signal decay between both acquisitions. It remains to be seen if different signal intensities will allow a reliable estimation of the distortion field.

Another important source of artifacts in DWI is subject motion. If the head is not stationary between blip-up and down acquisitions, we expect a blurring effect due to misaligned pixels and changes in the off-resonance field. The pixel misalignment issue can be addressed by employing optical prospective motion correction where we can assume that the voxel position is locked throughout the time series. However, dynamic field map changes between different head orientations relative to the main magnetic field remain a problem since the assumption of a static field map between up and down acquisition is no longer valid.

In conclusion, the extended hybrid-space SENSE approach provides a versatile reconstruction method that accounts for a wide variety of effects that disturb EPI acquisitions; among these effects are off-resonances, T2*-blurring, phase inconsistencies between multiple shots, and possibly T2-decay in multiple spin-echo acquisitions. The formulation of off-resonance correction in the k-space domain in combination with regularized reconstruction provides an alternative to distortion correction methods that operate in the image domain. The joint reconstruction of interleaved blip-up/down k-space data results in distortion and eddy-current corrected images with higher SNR due to increased number of k-space samples and reduced g-factor penalty.

F) Further Developments
F1) Single Shot Acquisition of Blip-Up Blip-Down Data

A variation of the preceding work is simultaneous acquisition of a blip-down navigator within the original blip-up host-EPI sequence. The navigator and the host-EPI sequence then have opposite geometric distortions (voxel stretching↔compression). Using image processing it is possible to derive an off-resonance map from the low resolution blip-down navigator and the host-EPI sequence. If both the navigator and the host sequence are accelerated, one can choose the sampling pattern in a way that the navigator fills in missing k-space samples. By performing a joint off-resonance corrected hybrid-SENSE reconstruction the g-factor penalty is reduced because of the higher sampling density in k-space.

Figure 10:
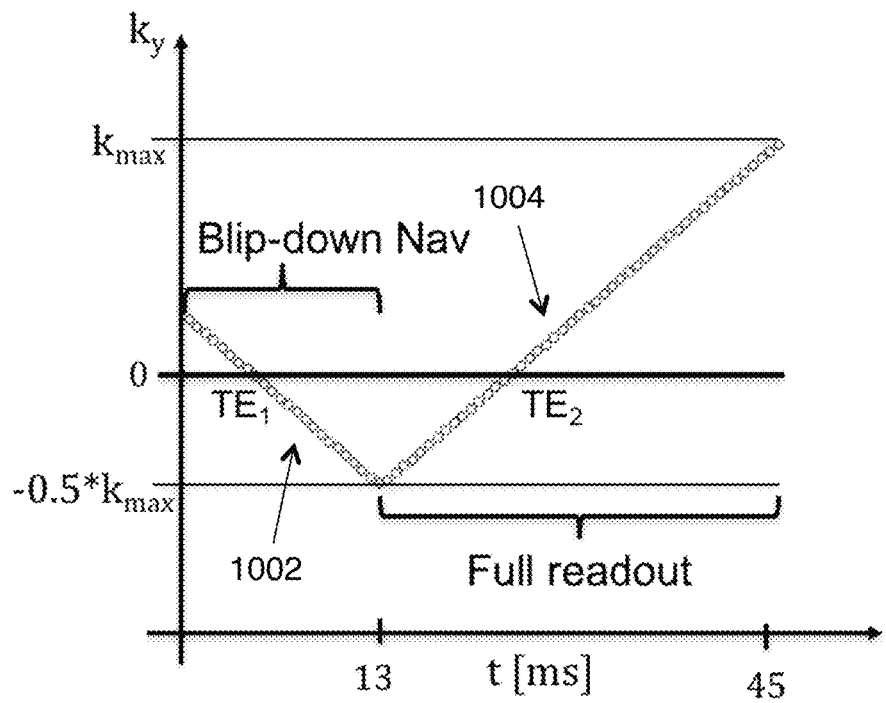
FIG. 10 shows blip-down navigator and blip-up host-EPI in a single continuous readout.

FIG. 10 shows a blip-down navigator 1002 and blip-up host-EPI acquisition 1004 in a single continuous readout. ⅝ Partial Fourier sampling and 2× in-plane acceleration is employed for the navigator and the full readout.

Measurements were performed at 3T using an 8-channel head coil array. All reconstructions are performed off-line using MatLab®. The "blip down navigated"-EPI acquisition is implemented by concatenating the blip-down navigator-EPI and the original EPI-acquisition while continuously playing out the EPI readout train (see FIG. 10). The resolution of the blip-down navigator was fixed to $N_{nav}$=64 and the same in-plane acceleration Ry=2 was used for both acquisitions. The following acquisition parameters were used: FOV=22×22 cm, $N_x \times N_y$=128×128, Ry=2; partial Fourier=0.75, esp=0.55 ms, slice thickness=2 mm, TR=3 s. The host-EPI and the navigator-EPI were reconstructed separately and a field map was estimated using FSL 5.0's topup function with default parameters.

Figure 11:
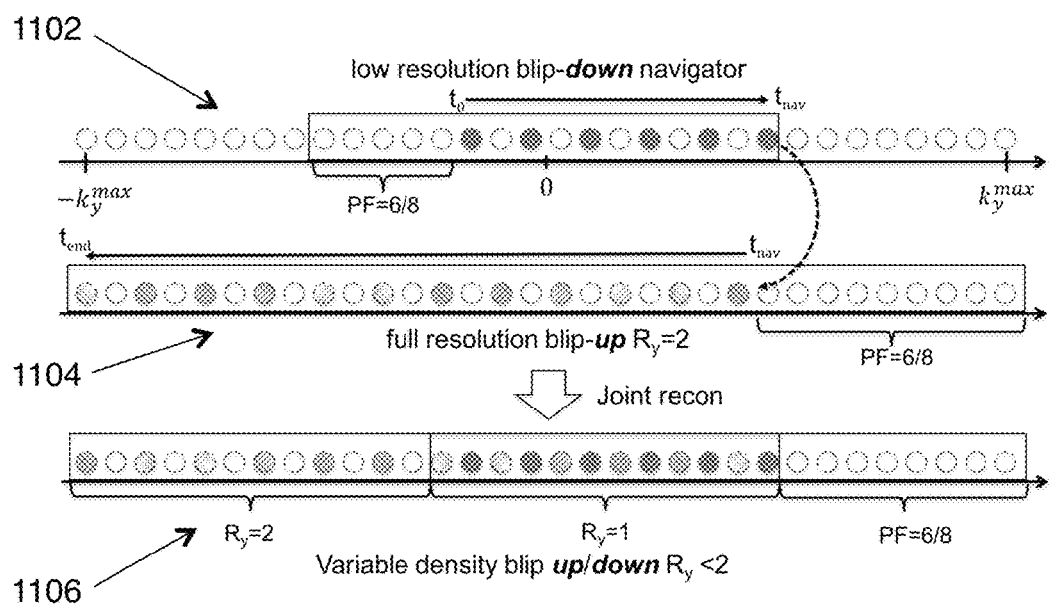
FIG. 11 shows interleaved navigator and host-EPI sampling patterns for 2× in-plane acceleration.

FIG. 11 shows interleaved navigator and host-EPI sampling patterns for 2× in-plane acceleration. 1102 shows the low resolution blip-down navigator. 1104 shows the full blip-up acquisitions shifted by one k-space sample relative to the navigator. 1106 shows combined (joint) sampling patterns with higher density sampling in the center of k-space.

Figure 12:
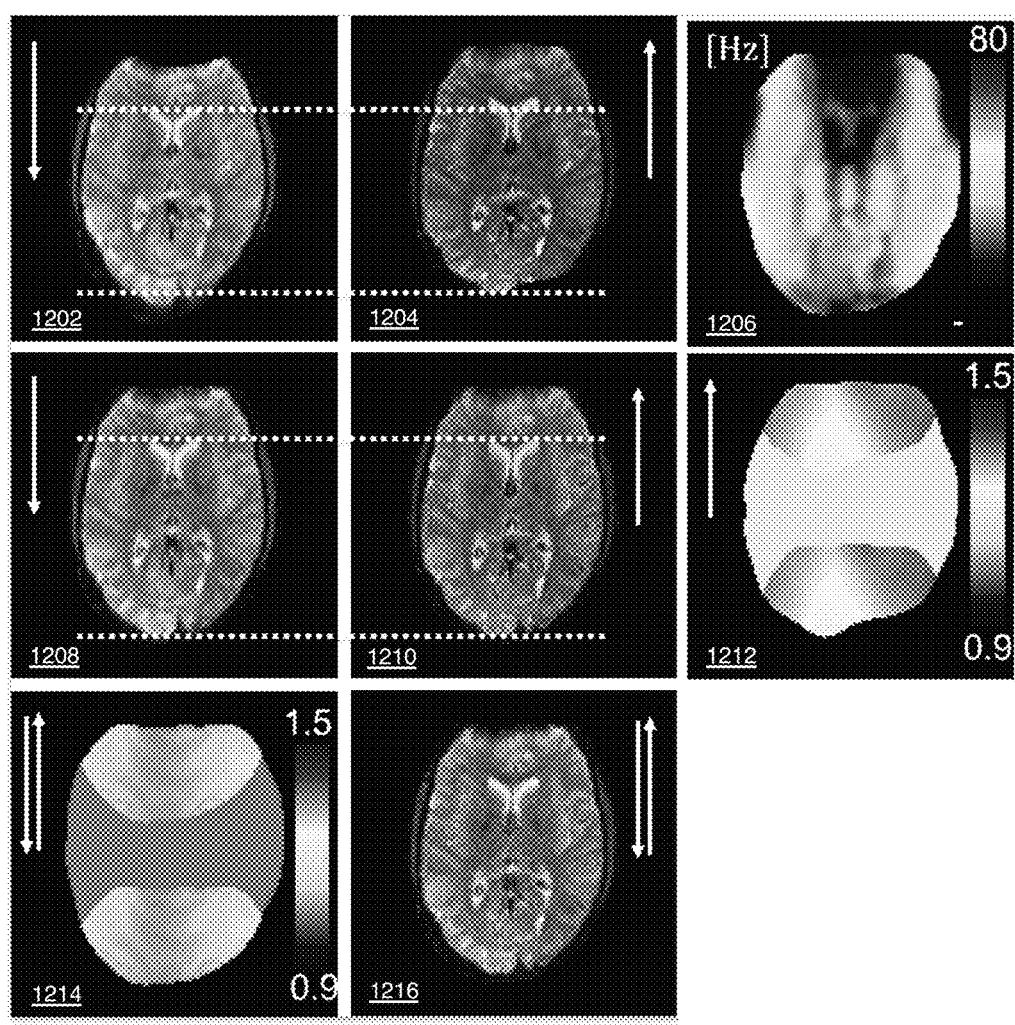
FIG. 12 shows results of joint blip-up/down reconstruction where the blip-up and blip-down are performed in a single continuous readout.

FIG. 12 displays separate reconstruction of the navigator 1202 and the host sequence 1204. The white arrow indicates the phase encoding direction (up or down). Uncorrected, both reconstruction experience geometric distortions in opposing directions relative to the white dashed lines that mark anatomical features of the image. The field map in Hz generated from 1202 and 1204 using FSL's topup function is displayed in 1206.

Performing an off-resonance corrected hybrid-SENSE reconstruction significantly reduces distortions and brings the navigator 1208 and the full readout 1210 into the same undistorted space that allows for a joint reconstruction 1216 with reduced g-factor penalty 1214. Because the undersampling pattern is identical for both acquisitions, they share a common noise enhancement (g-factor) map in 1212.

We have shown that it is feasible to acquire a blip-down navigator and the full resolution image in one continuous readout without significantly prolonging the acquisition time. The duration of the navigator is on the order of 10 ms which means we can neglect motion effects between both readouts. This allows for a snapshot of the dynamically changing off-resonance field in case of head motion or breathing fluctuations In contrast to methods that rely on the phase to estimate off-resonance changes, the blip up-down approach is not affected by flow or CSF pulsatility that can lead to erroneous phase estimations and thus incorrect off-resonance changes. The joint reconstruction has the additional benefit of reducing the g-factor penalty in a parallel imaging reconstruction.

F2) Improved Regularization of the Effective Encoding Matrix

Figure 13:
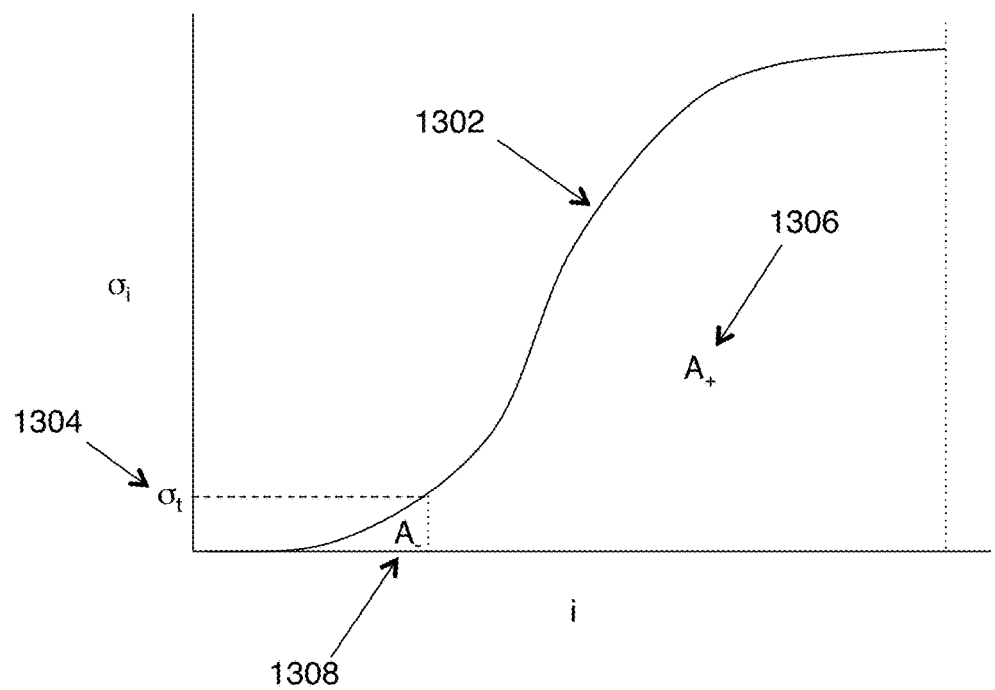
FIG. 13 shows an area ratio approach for setting the singular value threshold for regularizing the reconstruction.

FIG. 13 shows a presently preferred way to set the singular value threshold. Here 1302 is a curve of singular values $\sigma_i$ sorted from smallest to largest and then plotted vs. this sorting index i. A singular value threshold $\sigma_t$ (1304) defines two areas $A_+$ (1306) and $A_-$ (1308), where $A_+$ is the area under the singular value curve from singular values above the threshold and where $A_-$ is the area under the singular value curve from singular values below the threshold. Preferably the threshold $\sigma_t$ is chosen such that $A_+/(A_+ + A_-)$ is 95% (i.e., 95% of an area under a singular value curve of the effective joint encoding matrix is above the singular value threshold). For simplicity, this threshold condition is described as if the singular values of a matrix were a continuous distribution, instead of a discrete list. Thus the above-described threshold can be implemented in practice using any reasonable discretization of this area ratio concept. Specific threshold values other than 95% may also be useful in practice.

The invention claimed is:

1. A method of providing corrected magnetic resonance imaging (MRI), the method comprising:
    acquiring raw MRI data that is fully sampled in a first direction (x), undersampled in a second direction (y) and undersampled in a third direction (z), wherein the raw MRI data includes first raw MRI data and second raw MRI data having equal and opposite regular k-space encoding;
    performing a 1-D Fourier transformation of the raw MRI data in the first direction, thereby providing hybrid MRI data, wherein the hybrid MRI data includes first hybrid data ($s_{up}$) corresponding to the first raw MRI data and second hybrid data ($s_{down}$) corresponding to the second raw MRI data;
    determining a first effective encoding matrix ($F_{up}$) that includes at least the effects of regular k-space encoding and known phase variations due to system non-ideality for the first hybrid data;
    determining a second effective encoding matrix ($F_{down}$) that includes at least the effects of regular k-space encoding and known phase variations due to system non-ideality for the second hybrid data;
    determining a joint least-squares solution for magnetization (m) in a matrix equation ($s_{up}$, $s_{down}$)=($F_{up}$, $F_{down}$)m using a singular value decomposition of an effective joint encoding matrix ($F_{up}$, $F_{down}$);
    providing the magnetization (m) as an output.

2. The method of claim 1, wherein the first raw MRI data and the second raw MRI data are provided by a first acquisition of the first raw MRI data followed by a second acquisition of the second raw MRI data.

3. The method of claim 1, wherein the first raw MRI data and the second raw MRI data are provided by a single MRI acquisition.

4. The method of claim 1, wherein the first raw MRI data is sampled at first k-space points, wherein the second raw MRI data is sampled at second k-space points, and wherein the first k-space points and the second k-space points coincide.

5. The method of claim 1, wherein the first raw MRI data is sampled at first k-space points, wherein the second raw MRI data is sampled at second k-space points, and wherein the first k-space points and the second k-space points are interleaved with each other.

6. The method of claim 1, wherein regularization of the singular value decomposition of the effective joint encoding matrix is used to discard contributions from singular values less than a singular value threshold.

7. The method of claim 6, wherein the singular value threshold is adaptively selected such that 95% of an area under a singular value curve of the effective joint encoding matrix is from singular values above the singular value threshold.

8. The method of claim 1, wherein the first effective encoding matrix and the second effective encoding matrix further include effects of MRI receiver coil sensitivity variations.

9. The method of claim 1, wherein the first effective encoding matrix and the second effective encoding matrix further include effects of intensity variation of received raw MRI signals.

* * * * *